(12) United States Patent
Hobbs et al.

(10) Patent No.: US 12,424,829 B2
(45) Date of Patent: Sep. 23, 2025

(54) SWITCHGEAR CABINET ARRANGEMENT WITH CABLE ENTRY

(71) Applicant: RITTAL GMBH & CO. KG, Herborn (DE)

(72) Inventors: Steven Hobbs, Frankfurt-Rödelheim (DE); Barry Maidment, Southampton (GB)

(73) Assignee: RITTAL GMBH & CO. KG, Herborn (DE)

( * ) Notice: Subject to any disclaimer, the term of this patent is extended or adjusted under 35 U.S.C. 154(b) by 197 days.

(21) Appl. No.: 18/036,178

(22) PCT Filed: Oct. 14, 2021

(86) PCT No.: PCT/DE2021/100828
§ 371 (c)(1),
(2) Date: May 10, 2023

(87) PCT Pub. No.: WO2022/127967
PCT Pub. Date: Jun. 23, 2022

(65) Prior Publication Data
US 2024/0014637 A1    Jan. 11, 2024

(30) Foreign Application Priority Data

Dec. 14, 2020 (DE) .................. 20 2020 107 214.5

(51) Int. Cl.
*H05K 5/02* (2006.01)
*H02B 1/30* (2006.01)
*H02B 1/32* (2006.01)

(52) U.S. Cl.
CPC ............ *H02B 1/305* (2013.01); *H02B 1/303* (2013.01); *H02B 1/32* (2013.01); *H05K 5/0247* (2013.01)

(58) Field of Classification Search
None
See application file for complete search history.

(56) References Cited

U.S. PATENT DOCUMENTS 5,574,251 A * 11/1996 Sevier .................. H05K 7/183
                                                   174/50
6,401,940 B1 * 6/2002 Hartel ................... H02B 1/301
                                                   361/829

(Continued)

FOREIGN PATENT DOCUMENTS

DE    19811752 C1    1/2000
DE    10007470 A1    8/2001
(Continued)

OTHER PUBLICATIONS

International Search Report (English and German) and Written Opinion of the ISA (German) issued in PCT/DE2021/100828, mailed Jan. 24, 2022; ISA/EP.

(Continued)

*Primary Examiner* — Xanthia C Relford
(74) *Attorney, Agent, or Firm* — Harness, Dickey & Pierce, P.L.C.

(57) ABSTRACT

A switchgear cabinet arrangement having at least one switchgear cabinet housing which has a cable entry on its upper side, wherein the cable entry has a baffle along which at least one cable, conductor or line with a predetermined radius of curvature is introduced into the switchgear cabinet housing.

15 Claims, 5 Drawing Sheets

(56) References Cited

U.S. PATENT DOCUMENTS

Figure 1:
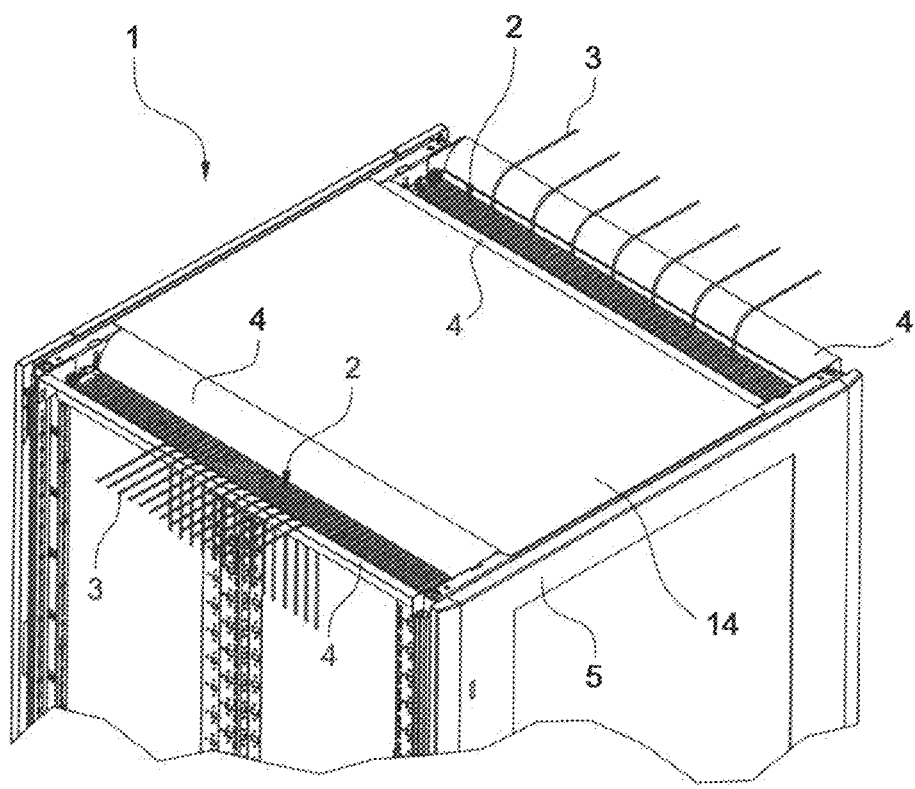

| | | | |
|---|---|---|---|
| 11,382,229 B2* | 7/2022 | Wang | H05K 7/1491 |
| 2003/0189394 A1 | 10/2003 | Hartel | |
| 2011/0080078 A1* | 4/2011 | Perschon | H02B 1/50 |
| | | | 248/68.1 |
| 2015/0188298 A1* | 7/2015 | Lutze | H02B 1/34 |
| | | | 211/26 |
| 2018/0130718 A1* | 5/2018 | Kawazu | G02B 6/4279 |
| 2021/0408770 A1* | 12/2021 | Thielmann | H02B 1/012 |

FOREIGN PATENT DOCUMENTS

| | | | | |
|---|---|---|---|---|
| EP | 2515397 A1 * | 10/2012 | | H02B 1/305 |
| NO | 310010 B1 | 4/2001 | | |

OTHER PUBLICATIONS

Chatsworth, "N-Seres Teraframe Radius Drop" Oct. 29, 2020 (Oct. 29, 2020), Retrieved from the Internet: https://web.archive.org/web/20201029200551/https://www.chatsworth.com/en-us/products/cabinets-enclosures-containment/accessories/cable-management [retrieved on Jan. 7, 2022] XP055876921.

* cited by examiner

SWITCHGEAR CABINET ARRANGEMENT WITH CABLE ENTRY

CROSS-REFERENCE TO RELATED APPLICATIONS

This application is a U.S. National Phase application under 35 U.S.C. 371 of International Application No. PCT/DE2021/100828, filed on Oct. 14, 2021, which claims the benefit of German Patent Application No. 20 2020 107 214.5, filed on Dec. 14, 2020. The entire disclosures of the above applications are incorporated herein by reference.

BACKGROUND

This section provides background information related to the present disclosure which is not necessarily prior art.

TECHNICAL FIELD

The invention is based on a switchgear cabinet arrangement with at least one switchgear cabinet housing which has a cable entry on its upper side. Such a switchgear cabinet arrangement is known from DE 198 117 52 C1.

DISCUSSION

The known cable entries have the disadvantage that they are not suitable for the cable-protecting introduction of cables, conductors, lines and the like into the switchgear cabinet interior. This is already due to the fact that the cables, for example electrical conductors, bent over the top and one edge of the cable entry, are introduced into the switchgear cabinet housing in a free-falling manner. The known cable entries also do not permit the orderly introduction. Rather, the cable entry is usually in the form of an unordered cable bundle.

SUMMARY

This section provides a general summary of the disclosure, and is not a comprehensive disclosure of its full scope or all of its features.

It is therefore the task of the invention to further develop a switchgear cabinet arrangement of the type described at the beginning in such a way that it permits, on the one hand, cable entry that is gentle on the material and, on the other hand, cable entry in an orderly manner.

Accordingly, it is provided that the cable entry has a preferably removable baffle along which at least one cable, conductor or line is introduced into the switchgear cabinet housing with a predetermined radius of curvature. The radius of curvature can be selected, for example depending on the cross-sections and materials of the inserted conductors, lines and the like, in such a way that damage to them is effectively avoided.

If the cable entry, preferably the baffle of the cable entry is designed to be removable, for example by allowing the cable entry, preferably the baffle to be dismantled from the switchgear cabinet housing, the insertion of large quantities of cables (cable bundles) is made possible. Otherwise, when the frame is closed in the roof area of a frame of a switchgear cabinet housing, the cables would always have to be inserted from above through openings in the roof, which would involve a great deal of effort.

With the aid of the cable entry, for example, an insertion gap extending over the entire width or depth of the roof panel of the switchgear cabinet housing can be created so that a large number of conductors can be inserted into the switchgear cabinet housing next to each other and thus in an orderly manner along the specified radius of curvature, thus protecting the material.

The at least one cable, the at least one conductor or the at least one line can be guided along the baffle from the horizontal to the vertical. In particular, the baffle can have a 90° guide that is circular-segment-shaped in vertical cross section.

The baffle can be designed as a horizontal width strut or as a horizontal depth strut. This can extend between opposing profile struts of a frame of the switchgear cabinet housing. Alternatively, the width strut or the depth strut can also replace a profile strut of the frame. For example, it may be provided that the baffle is integrally formed on such a profile strut of the frame.

The width strut or the depth strut can have fastening means on the fastening flanges facing opposite profile struts, via which the width strut or the depth strut is hooked into the respective profile strut of the frame.

The fastening means can engage in a system perforation of regularly spaced fastening receptacles of the profile struts so that the fastening position of the baffle is variable in relation to the frame. This can be used to vary the position of the cable entry and/or to vary a clear opening dimension of an insertion gap of the cable entry.

The fastening means may include fastening means for pre-positioning the baffle with respect to the frame and fastening means for frictionally connecting the baffle to the frame. The two types of fastening means may be designed as the same fastening means.

The means for the frictional connection can have an aperture in the fastening flange which is aligned with a preferably geometrically identical aperture in the system perforation of the frame. A snap-in connector can be inserted through the aligned openings in the fastening flange and the frame.

The baffle may be molded to a width or depth strut of a rectangular horizontal roof frame of a frame of the enclosure, or it may replace the width or depth strut.

The baffle can limit an insertion gap of the cable entry with an opposite delimiting element.

The opposite delimiting element can be another baffle, which is oriented mirror-symmetrically to the first baffle, so that cables, conductors, or lines can be fed from opposite sides to the insertion gap along a respective curvature of the respective baffle.

The further baffle can be integrally formed on a roof panel of the switchgear cabinet housing or provided as an edging of the roof panel. The bend can be designed to face the baffle.

The baffle and/or the further baffle may have a radius of curvature in the vertical plane which is at least 0.5 cm and preferably at least 1 cm.

A brush strip can be mounted on a free horizontal edge of the baffle, which extends in the width direction in the case of a width strut and in the depth direction in the case of a depth strut, and which faces an interior of the switchgear cabinet housing.

A plurality of bristles of the brush strip can extend in a horizontal direction. For example, the bristles of the brush strip can extend perpendicular to an insertion direction of a plug-in groove of the brush strip, with which the brush strip is inserted onto a free longitudinal edge of a baffle.

A further brush strip can be attached to a further baffle on a roof panel of the switchgear cabinet housing. The two brush strips can be arranged opposite each other with their free ends facing each other and preferably adjacent to each other.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 2:
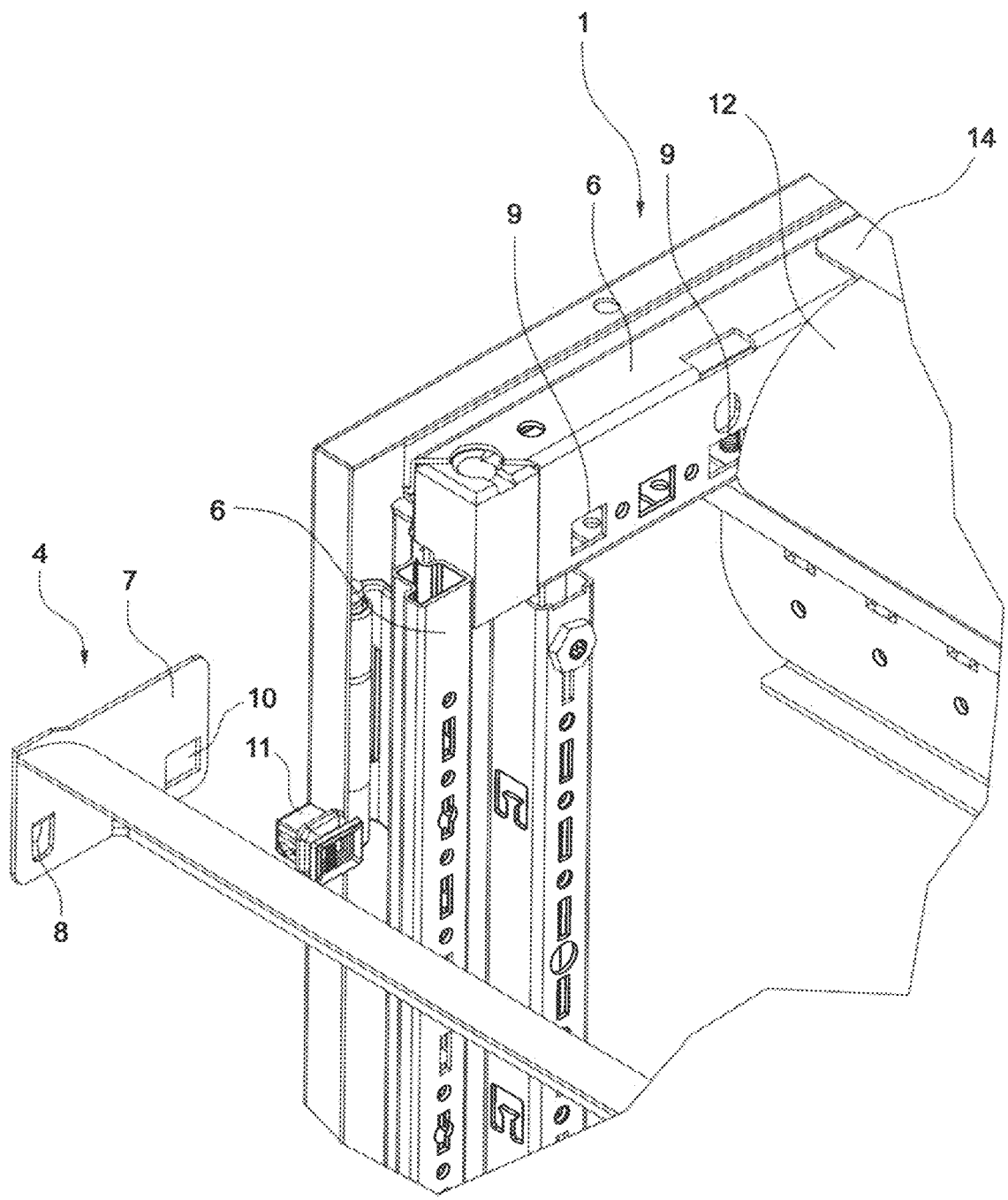
Figure 3:
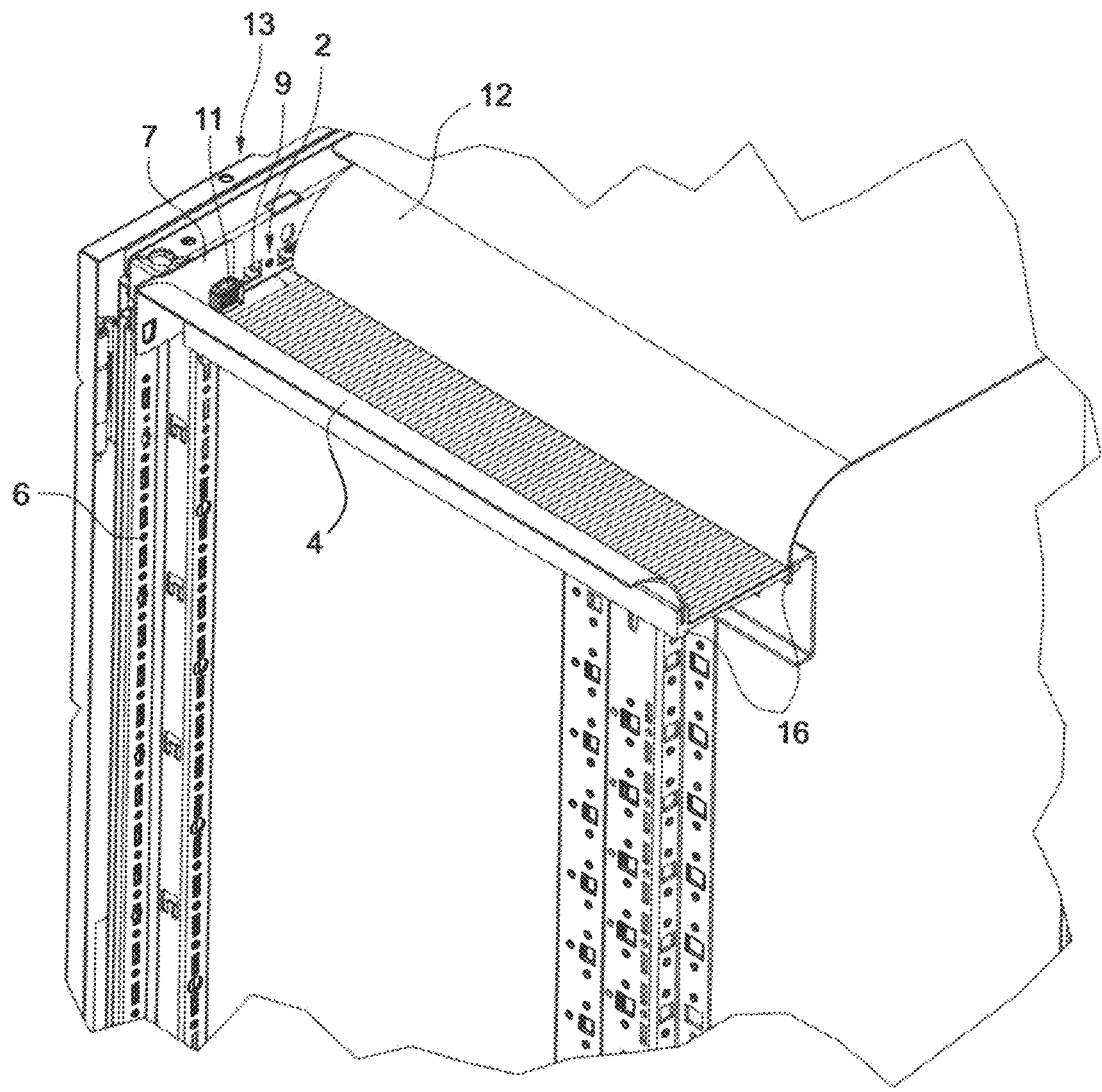
Figure 4:
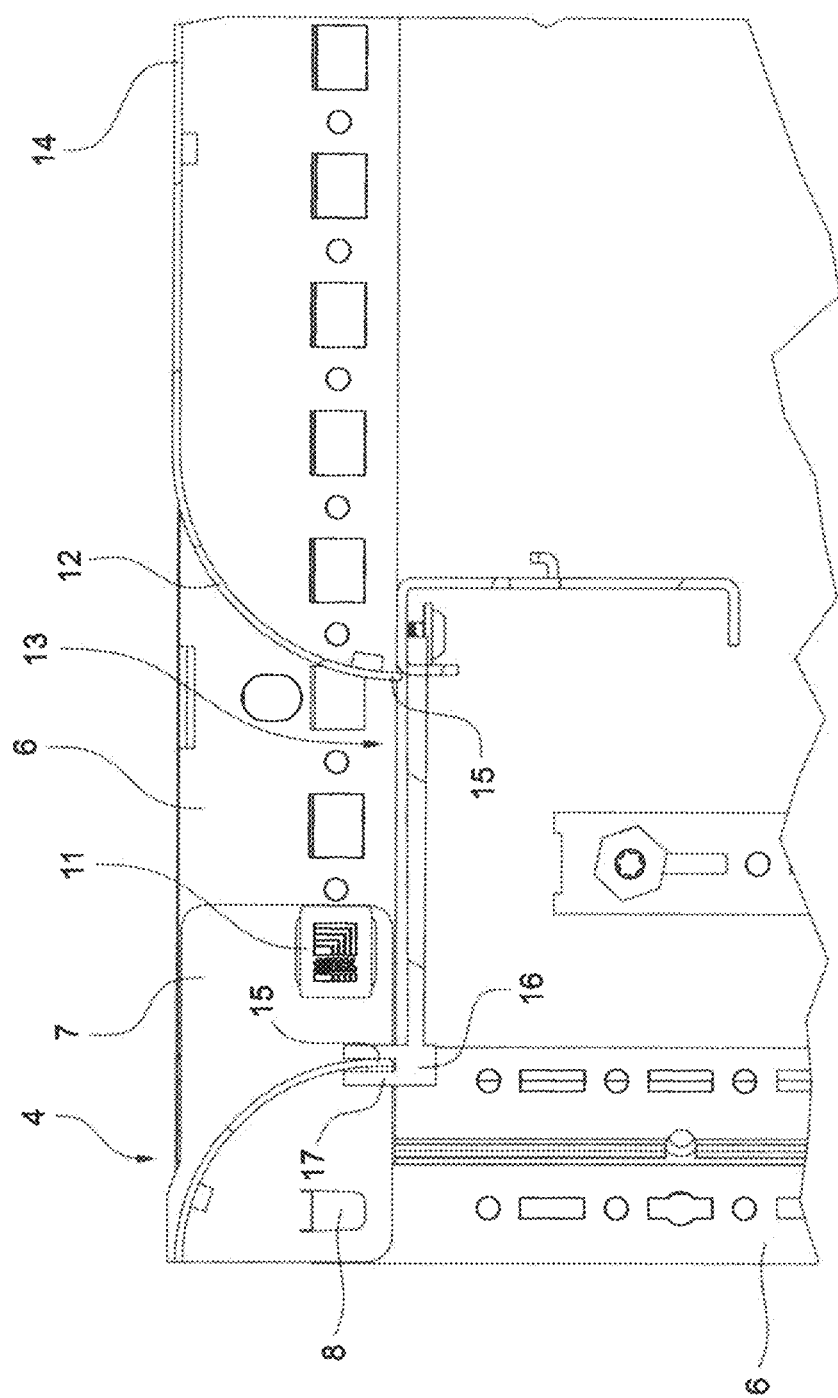
Figure 5:
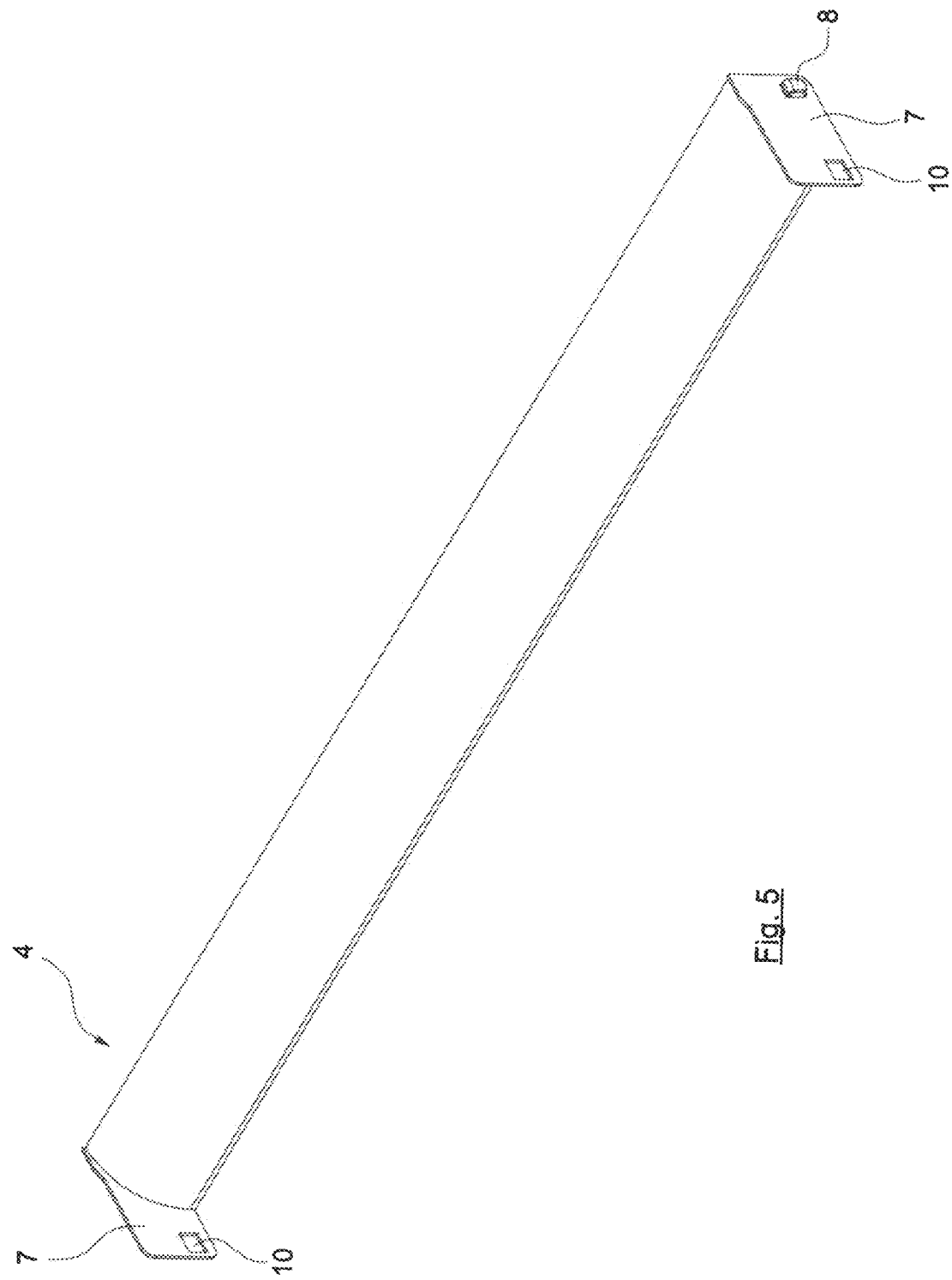

Further details of the invention are explained with reference to the figures below. Thereby shows:

FIG. 1 a top perspective view of an embodiment of a switchgear cabinet arrangement according to the invention;

FIG. 2 a section of a top perspective view of a further embodiment of the invention;

FIG. 3 a cutaway view of yet another embodiment of a switchgear cabinet arrangement according to the invention;

FIG. 4 a side view of a switchgear cabinet arrangement according to the invention; and FIG. 5 a width strut or depth strut according to an embodiment of the invention.

DETAILED DESCRIPTION

Example embodiments will now be described more fully with reference to the accompanying drawings.

FIG. 1 illustrates the advantages of switchgear cabinet arrangements according to the invention compared with those known from the prior art. The arrangement according to the invention allows the cable entry 2 to be formed over the entire depth of the switchgear cabinet frame, so that different cables can be introduced in an orderly manner next to each other in the depth direction of the switchgear cabinet housing. Due to the radius of curvature of the baffles 4, the cable entry is also gentle on the material, so that cable breaks and the like can be effectively avoided.

It can also be seen in FIG. 1 that the baffles can replace a profile strut of the frame 6 of the switchgear cabinet housing 1, in the present case opposite depth struts of the roof frame of the frame 1. The cable entries 2 are consequently formed between a roof panel 14 arranged centrally between the baffles 4 and the two outer baffles 4. The roof panel 14 can also have, facing the two outer baffles 4, a further integrally formed baffle 4 on each of its opposite edges, for example in the form of a 90° bend with a radius of curvature of more than 0.5 cm, for example. With the aid of these additional baffles 4 on the roof panel 14, it is possible to insert cables in an orderly and gentle manner from an opposite side of the switchgear cabinet housing 1 over the roof panel 14 into the interior of the switchgear cabinet.

FIG. 2 illustrates an embodiment in which the baffle 4 replaces a depth strut of an upper roof frame of a switchgear cabinet housing 1, in which the depth strut is fixed between opposite width struts of a roof frame of the switchgear cabinet housing via fastening means 8, 9, 10, 11. The fastening means 8, 9, 10, 11 have first fastening means 8, 9 for the positive connection between the flange 7 and the frame 6 and second fastening means 9, 10, 11 for the non-positive connection of the flange 7 to the frame 6. With the aid of the first fastening means 8, 9 for the positive connection, it is possible to pre-position the baffle 4 with respect to the frame 6 in order to produce a non-positive connection with the aid of the second fastening means 10, 11 when the baffle 4 assumes a desired position, for example with respect to the roof panel 14.

The roof panel 14 has a delimiting element 12 facing the guide sheet 4, which is designed as a further guide sheet and is arranged in mirror symmetry to the guide sheet 4. From a synopsis of FIGS. 3 and 4 it can be seen that with such an arrangement of the baffle 4 in relation to the delimiting element 12 of the roof panel 14, the insertion gap 2 is formed between the baffle 4 and the delimiting element 12 and is defined in grade by the clear opening dimension between the free ends of the baffle 4 and the delimiting element 12. In the manner known from the prior art, brush strips 16 can be provided to prevent dust from entering the interior of the switchgear cabinet, which close off the entry 2 so that it is permeable to conductors.

With reference to FIG. 4, it can be seen that the brush strips have a vertical plug-in groove and bristles extending perpendicular to the insertion direction of the groove, whereby a brush strip 16 can be attached to both the baffle 4 and the delimiting element 12, in particular to their horizontal free edges. Alternatively, however, it is also conceivable that a brush strip is fitted onto only one of the two free edges mentioned, which closes the entire horizontal clear opening dimension of the cable entry 2.

FIG. 5 shows an exemplary embodiment of a baffle 4, which can be designed as a simple sheet metal part. In particular, the baffle 4 can be formed from a central sheet having the curvature, which only has a flange 7 on each of its opposite end faces for fastening the baffle to the frame of the switchgear cabinet housing. The radius of curvature should be at least 0.5 cm to allow particularly gentle cable entry. Particularly preferably, the radius of curvature is more than 1 cm.

The features of the invention disclosed in the foregoing description, in the drawings as well as in the claims may be essential to the realization of the invention both individually and in any combination.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A switchgear cabinet arrangement comprising at least one switchgear cabinet housing, which has a cable entry on its upper side, the cable entry having a preferably removable baffle, along which at least one cable, a conductor or a line with a predetermined radius of curvature is introduced into the switchgear cabinet housing, wherein the baffle is formed on or replaces a width or depth strut of a rectangular horizontal roof frame of a frame of the switchgear cabinet enclosure.

2. The switchgear cabinet arrangement according to claim 1, wherein the at least one cable, the at least one conductor, or the at least one line is guided along the baffle from the horizontal to the vertical.

3. The switchgear cabinet arrangement according to claim 1, wherein the baffle is designed as a horizontal width strut or depth strut which extends between opposing profile struts of a frame of the switchgear cabinet housing.

4. The switchgear cabinet arrangement according to claim 3, in which the width strut or the depth strut has fastening means on the fastening flanges facing opposite profile struts, via which fastening means the width strut or the depth strut is suspended in the respective profile strut of the frame.

5. The switchgear cabinet arrangement according to claim 4, in which the fastening means engage in a system perforation of regularly spaced fastening receptacles of the profile struts, so that the fastening position of the baffle is variable with respect to the frame.

6. The switchgear cabinet assembly according to claim 4, wherein the fastening means comprises fastening means for pre-positioning the baffle with respect to the frame and fastening means for force-fit connection of the baffle to the frame.

7. The switchgear cabinet arrangement according to claim 6, in which the means for the non-positive connection have an opening in the fastening flange which is aligned with a preferably geometrically identically formed opening of the system perforation of the frame, a snap-in connector being inserted through the aligned openings of the fastening flange and of the frame.

8. The switchgear cabinet arrangement according to claim 1, in which the baffle delimits an insertion gap of the cable entry with an opposite delimiting element.

9. The switchgear cabinet arrangement according to claim 8, wherein the opposite delimiting element is a further baffle which is oriented mirror-symmetrically to the first baffle so that cables, conductors, or lines can be fed from opposite sides to the insertion gap along a respective curvature of the respective baffle.

10. The switchgear cabinet arrangement according to claim 9, wherein the further baffle is integrally formed on a roof panel of the switchgear cabinet housing or is provided as an edging of the roof panel.

11. The switchgear cabinet arrangement according to claim 1, in which the baffle and/or the further baffle has/have a radius of curvature in the vertical plane which is at least 0.5 cm.

12. The switchgear cabinet arrangement according to claim 1, in which a brush strip is plugged onto a free horizontal edge of the baffle, which extends in the width direction in the case of a width strut and in the depth direction in the case of a depth strut of the switchgear cabinet housing and which faces an interior space of the switchgear cabinet housing.

13. The switchgear cabinet assembly according to claim 12, wherein a plurality of bristles of the brush strip extend in a horizontal direction.

14. The switchgear cabinet assembly according to claim 12, wherein the bristles of the brush strip extend perpendicularly to an insertion direction of a plug-in groove of the brush strip.

15. The switchgear cabinet arrangement according to claim 12, in which a further brush strip is plugged onto a further baffle on a roof panel of the switchgear cabinet housing, the two brush strips being arranged opposite one another with their free ends facing one another and preferably adjoining one another.

\* \* \* \* \*